United States Patent
Chen et al.

(10) Patent No.: US 9,111,817 B2
(45) Date of Patent: Aug. 18, 2015

(54) BUMP STRUCTURE AND METHOD OF FORMING SAME

(71) Applicant: Taiwan Semiconductor Manufacturing Company, Ltd., Hsin-Chu (TW)

(72) Inventors: Guan-Yu Chen, Hsin-Chu (TW); Yu-Wei Lin, New Taipei (TW); Yu-Jen Tseng, Hsin-Chu (TW); Tin-Hao Kuo, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 56 days.

(21) Appl. No.: 13/712,722

(22) Filed: Dec. 12, 2012

(65) Prior Publication Data

US 2014/0077358 A1 Mar. 20, 2014

Related U.S. Application Data

(60) Provisional application No. 61/707,442, filed on Sep. 28, 2012, provisional application No. 61/707,609, filed on Sep. 28, 2012, provisional application No. 61/707,644, filed on Sep. 28, 2012, provisional application No. 61/702,624, filed on Sep. 18, 2012.

(51) Int. Cl.
*H01L 23/48* (2006.01)
*H01L 23/00* (2006.01)
(Continued)

(52) U.S. Cl.
CPC .......... *H01L 24/13* (2013.01); *H01L 21/76885* (2013.01); *H01L 24/16* (2013.01);
(Continued)

(58) Field of Classification Search
CPC .......... H01L 2224/13166; H01L 2224/13565; H01L 2224/1357; H01L 2224/13686; H01L 2224/14051; H01L 2224/16238; H01L 2224/16503; H01L 2224/81191; H01L 2224/81424; H01L 2224/81439; H01L 224/81444; H01L 2224/81447; H01L 2224/8181
See application file for complete search history.

(56) References Cited

U.S. PATENT DOCUMENTS 4,811,082 A 3/1989 Jacobs et al.
4,990,462 A 2/1991 Sliwa, Jr.
(Continued)

FOREIGN PATENT DOCUMENTS

CN 101080138 11/2007
KR 1020110002816 A 1/2011
(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Bilkis Jahan
*Assistant Examiner* — Kevin Quinto
(74) *Attorney, Agent, or Firm* — Slater & Matsil, L.L.P.

(57) ABSTRACT

An embodiment bump on trace (BOT) structure includes a contact element supported by an integrated circuit, an under bump metallurgy (UBM) feature electrically coupled to the contact element, a metal bump on the under bump metallurgy feature, and a substrate trace on a substrate, the substrate trace coupled to the metal bump through a solder joint and intermetallic compounds, a ratio of a first cross sectional area of the intermetallic compounds to a second cross sectional area of the solder joint greater than forty percent.

20 Claims, 5 Drawing Sheets

(51) Int. Cl.
*H01L 21/768* (2006.01)
*H01L 21/48* (2006.01)
*H01L 23/498* (2006.01)

(52) U.S. Cl.
CPC ....... *H01L21/4853* (2013.01); *H01L 23/49811* (2013.01); *H01L 24/11* (2013.01); *H01L 24/14* (2013.01); *H01L 24/81* (2013.01); *H01L 2224/11462* (2013.01); *H01L 2224/11472* (2013.01); *H01L 2224/13015* (2013.01); *H01L 2224/13017* (2013.01); *H01L 2224/1357* (2013.01); *H01L 2224/13082* (2013.01); *H01L 2224/13083* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13565* (2013.01); *H01L 2224/13686* (2013.01); *H01L 2224/14051* (2013.01); *H01L 2224/16238* (2013.01); *H01L 2224/16503* (2013.01); *H01L 2224/8181* (2013.01); *H01L 2224/81191* (2013.01); *H01L 2224/81424* (2013.01); *H01L 2224/81439* (2013.01); *H01L 2224/81444* (2013.01); *H01L 2224/81447* (2013.01); *Y10T 29/49144* (2015.01)

(56) References Cited

U.S. PATENT DOCUMENTS

| | | |
|---|---|---|
| 5,075,253 A | 12/1991 | Sliwa, Jr. |
| 5,075,965 A | 12/1991 | Carey et al. |
| 5,130,779 A | 7/1992 | Agarwala et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,542,601 A | 8/1996 | Fallon et al. |
| 5,587,337 A * | 12/1996 | Idaka et al. .......... 438/613 |
| 5,680,187 A | 10/1997 | Nagayama et al. |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,082,610 A | 7/2000 | Shangguan et al. |
| 6,091,141 A | 7/2000 | Heo |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,346,469 B1 | 2/2002 | Greer |
| 6,355,501 B1 | 3/2002 | Fung et al. |
| 6,358,847 B1 * | 3/2002 | Li et al. .......... 438/687 |
| 6,424,037 B1 | 7/2002 | Ho et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,492,197 B1 | 12/2002 | Rinne |
| 6,498,308 B2 | 12/2002 | Sakamoto |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,251,484 B2 | 7/2007 | Aslanian |
| 7,271,483 B2 | 9/2007 | Lin et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,576,435 B2 | 8/2009 | Chao |
| 7,659,631 B2 | 2/2010 | Kamins et al. |
| 7,804,177 B2 | 9/2010 | Lu et al. |
| 7,834,450 B2 | 11/2010 | Kang |
| 7,946,331 B2 | 5/2011 | Trezza et al. |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,435,881 B2 | 5/2013 | Choi et al. |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0092219 A1 | 5/2003 | Ouchi et al. |
| 2004/0140538 A1 | 7/2004 | Harvey |
| 2004/0159944 A1 | 8/2004 | Datta et al. |
| 2004/0212098 A1 | 10/2004 | Pendse |
| 2005/0062153 A1 | 3/2005 | Saito et al. |
| 2005/0212114 A1 | 9/2005 | Kawano et al. |

(56) References Cited

U.S. PATENT DOCUMENTS

| | | |
|---|---|---|
| 2005/0224991 A1 | 10/2005 | Yeo |
| 2006/0012024 A1 | 1/2006 | Lin et al. |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0209245 A1 | 9/2006 | Mun et al. |
| 2006/0292824 A1* | 12/2006 | Beyne et al. ............. 438/455 |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1* | 1/2007 | Chiu et al. ............... 438/597 |
| 2007/0023483 A1 | 2/2007 | Yoneyama et al. |
| 2007/0057022 A1 | 3/2007 | Mogami et al. |
| 2007/0200234 A1 | 8/2007 | Gerber et al. |
| 2008/0023850 A1 | 1/2008 | Lu et al. |
| 2008/0128911 A1* | 6/2008 | Koyama .................... 257/759 |
| 2008/0150135 A1 | 6/2008 | Oyama et al. |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0075469 A1 | 3/2009 | Furman et al. |
| 2009/0096092 A1 | 4/2009 | Patel |
| 2009/0108443 A1 | 4/2009 | Jiang |
| 2009/0149016 A1* | 6/2009 | Park et al. ................. 438/614 |
| 2009/0166861 A1 | 7/2009 | Lehr et al. |
| 2009/0174067 A1 | 7/2009 | Lin |
| 2010/0007019 A1 | 1/2010 | Pendse |
| 2010/0044860 A1 | 2/2010 | Haba et al. |
| 2010/0141880 A1 | 6/2010 | Koito et al. |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0244675 A1 | 10/2011 | Huang et al. |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007231 A1 | 1/2012 | Chang |
| 2012/0012997 A1 | 1/2012 | Shen et al. |
| 2012/0091577 A1 | 4/2012 | Hwang et al. |
| 2012/0098120 A1 | 4/2012 | Yu et al. |
| 2012/0146168 A1 | 6/2012 | Hsieh et al. |
| 2012/0306080 A1 | 12/2012 | Yu et al. |
| 2013/0026622 A1 | 1/2013 | Chuang et al. |
| 2013/0087920 A1 | 4/2013 | Jeng et al. |
| 2013/0093079 A1 | 4/2013 | Tu et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2014/0054764 A1 | 2/2014 | Lu et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077360 A1 | 3/2014 | Lin et al. |
| 2014/0077365 A1 | 3/2014 | Lin et al. |

FOREIGN PATENT DOCUMENTS

| | | |
|---|---|---|
| KR | 1020110128532 A | 11/2011 |
| TW | 200826265 | 6/2008 |
| TW | 200915452 | 4/2009 |

* cited by examiner

BUMP STRUCTURE AND METHOD OF FORMING SAME

CROSS-REFERENCE TO RELATED APPLICATIONS

This application claims the benefit of U.S. Provisional Application No. 61/707,442, filed on Sep. 28, 2012, entitled "Bump Structure and Method of Forming Same," of U.S. Provisional Application No. 61/707,609, filed on Sep. 28, 2012, entitled "Interconnection Structure Method of Forming Same," of U.S. Provisional Application No. 61/707,644, filed on Sep. 28, 2012, entitled "Metal Bump and Method of Manufacturing Same," and of U.S. Provisional Application No. 61/702,624, filed on Sep. 18, 2012, entitled "Ladd Bump Structures and Methods of Making the Same," which applications are hereby incorporated herein by reference.

BACKGROUND

In the trend of smaller package and higher input/output (I/O) counts, a finer pitch is needed for a flip-chip bump on trace (BOT) package. The finer pitch requirement causes bump dimensions to shrink. As such, the area of metal/solder interface (metal bump) and solder/trace joint interface also decreases. So, electromigration (EM) resistance at both "bump-to-trace" and "trace-to-bump" sites get worse due to higher current density.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a bump structure for a bump on trace (BOT) assembly. The concepts in the disclosure may also apply, however, to other semiconductor structures or circuits.

Figure 1:
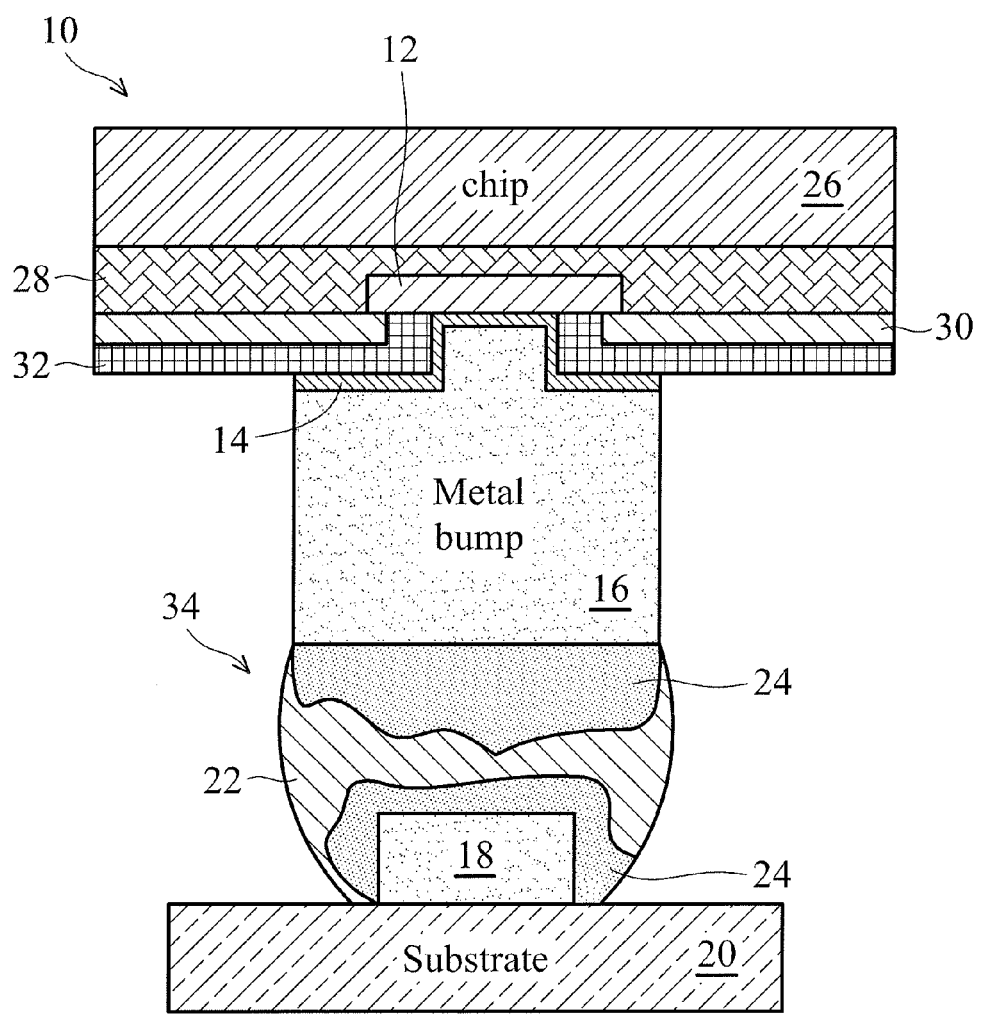
FIG. 1 is a cross sectional view of an embodiment bump on trace (BOT) structure.

Referring now to FIG. 1, an embodiment bump on trace (BOT) structure 10 is illustrated. As shown, the BOT structure 10 includes a contact element 12, an under bump metallurgy (UBM) feature 14, a metal bump 16, a substrate trace 18, a substrate 20, a solder joint 22, and intermetallic compounds (IMCs) 24.

In an embodiment, the contact element 12 is an aluminum (Al) pad. As shown in FIG. 1, the contact element 12 is generally supported by an integrated circuit 26 (i.e., chip). Various layers and features of the integrated circuit 26, including transistors, interconnect layers, post passivation interconnects, redistribution layers, and the like are omitted from the figures for the sake of clarity, as they are not necessary to an understanding of the present disclosure.

In an embodiment, an insulating layer 28 is disposed between the contact element 12 and the integrated circuit 26. In an embodiment, the insulating layer 28 comprises an extremely low-k (ELK) dielectric. In an embodiment, a passivation layer 30 overlies the integrated circuit 26 (and/or the insulating layer 28). As shown in FIG. 1, the passivation layer 30 may have a passivation opening exposing the contact element 12. In an embodiment, a polyimide layer 32 overlies the passivation layer 30. The polyimide layer 32 may have a polyimide opening exposing the contact element 12.

Still referring to FIG. 1, the UBM feature 14 is electrically coupled to the contact element 12. In an embodiment, the UBM feature 14 is formed from titanium (Ti), titanium nitride (TiN) copper nickel (CuNi), aluminum (Al), and the like to a thickness of, perhaps, about 0.1 μm to about 5 μm, depending on the application. As shown, various layers including, for example, a passivation layer and a polyimide layer, may be disposed between portions of the UBM feature 14 and the contact element 12.

Still referring to FIG. 1, the metal bump 16 is mounted on the UBM feature 14. In an embodiment, the metal bump 16 is formed from a suitable material such as, for example, copper (Cu), nickel (Ni), gold (Au), palladium (Pd), titanium (Ti), and so on, or alloys thereof.

As shown in FIG. 1, the substrate trace 18 is generally mounted on the substrate 20. In an embodiment, the substrate trace 18 is formed from copper (Cu), nickel (Ni), gold (Au), aluminum (Al), silver (Ag), and so on, or alloys thereof. In an embodiment, the substrate trace 18 is coated with a surface treatment such as, for example, organic solderability preservatives (OSP), immersion tin (IT), and so on.

Still referring to FIG. 1, the substrate trace 18 is structurally and/or electrically coupled to the metal bump 16 through the solder joint 22 and the intermetallic compounds 24. In an embodiment, the solder joint 22 comprises tin (Sn), lead (Pb), or another suitable solder material.

In an embodiment, a ratio of a cross sectional area of the intermetallic compounds 24 to a cross sectional area of the solder joint 22 is greater than about forty percent (40%). In other words, the area occupied by the two spaced-apart portions of intermetallic compounds 24 in FIG. 1 account for greater than about 40% of the overall area of the conglomeration 34 coupling the metal bump 16 to the substrate trace 18. In addition, the area occupied by the solder joint 22 accounts for less than about 60% of the total area of the conglomeration 34.

The desired ratio of intermetallic compounds 24 to solder joint 22 may be obtained by, for example, decreasing a vertical height of the solder joint 22. The desired ratio may also be achieved by increasing the thermal budget during die attach to generate more of the intermetallic compounds 24 relative to the solder joint 22. Those skilled in the art will recognize that the ratio may be obtained by manipulating other process parameters or dimensions as well.

By maintaining the ratio of the intermetallic compounds 24 to the solder joint 22 in excess of forty percent, the electromigration (EM) resistance of the BOT device 10 is increased. This is due to the lower diffusivity of the combination of the intermetallic compounds 24 and the solder joint 22 relative to the diffusivity of the solder joint 22 alone in conventional BOT devices. Indeed, the lower diffusivity of the intermetallic compounds 24/solder joint 22 combination in FIG. 1 correlates to a lower atomic flux, which correlates to a slower electromigration failure time.

In an embodiment, an additional metal layer or material (not shown) is included in the conglomeration 34. For example, the additional metal layer or material may be disposed between the metal bump 16 and the solder joint 22 and/or the intermetallic compounds 24. In such cases, the substrate trace 18 is coupled to the metal bump 16 through the solder joint 22, intermetallic compounds 24, and the additional metal. In an embodiment, the additional metal may be nickel (Ni) or another conductive material.

Figure 2:
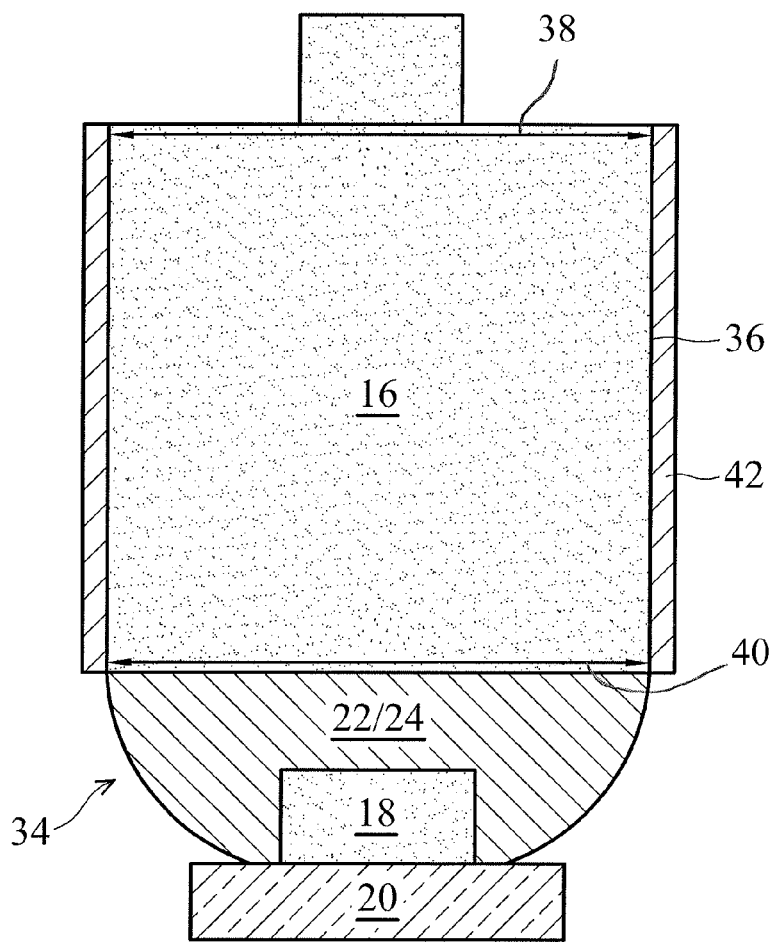
FIG. 2 is a cross sectional view of a metal bump suitable for use with the BOT structure of FIG. 1.

Referring now to FIG. 2, the metal bump 16 may be a vertical bump. As such, sidewalls 36 of the metal bump 16 may be vertical (as oriented in FIG. 2). In such an embodiment, a top width 40 of the metal bump 16 is the same as a bottom width 38. As shown in FIG. 2, in an embodiment a metal oxide 42 (e.g., cupric oxide, CuO, cuprous oxide, $Cu_2O$, aluminum oxide, $Al_2O_3$, etc.) is formed on the sidewalls 36 of the metal bump 16.

Figure 3:
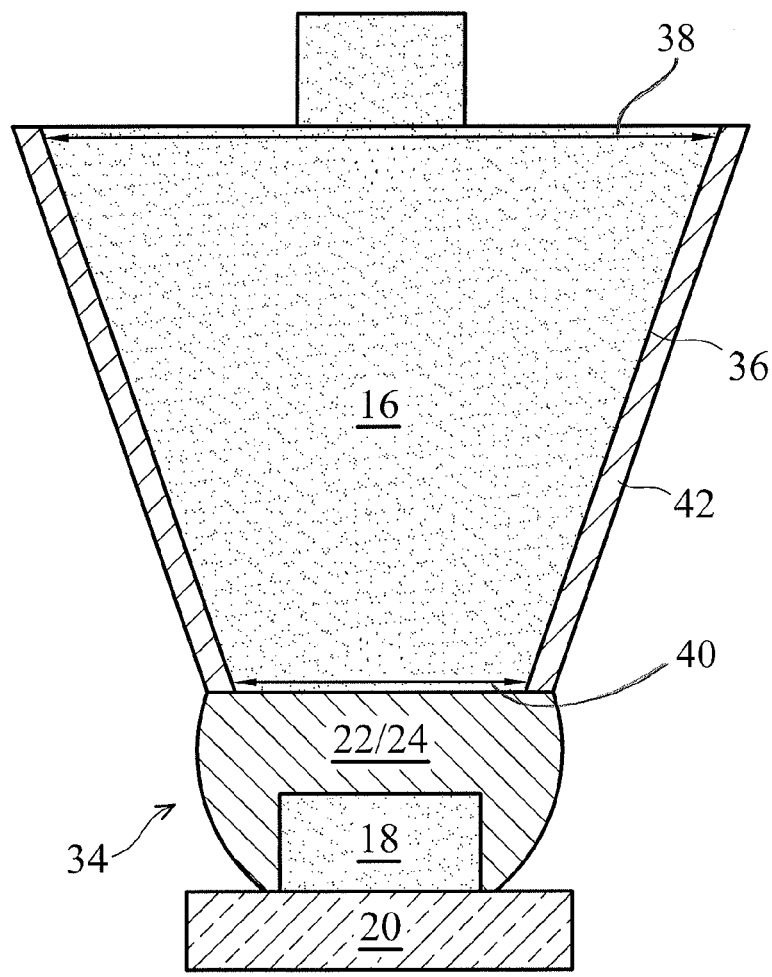
FIG. 3 is a cross sectional view of a metal bump suitable for use with the BOT structure of FIG. 1.

As shown in FIG. 3, the metal bump 16 may also be a ladder bump. As such, the metal bump 16 has a sloped or tapering profile. Indeed, the metal bump 16 generally has the shape of a truncated cone. In an embodiment, the sidewalls 36 of the metal bump 16 are linear from a distal end (which is closest to the conglomeration 34) to a mounted end of the metal bump 16 along an entire height (i.e., or length) of the sidewalls 36. As shown in FIG. 3, in an embodiment the metal bump 16 also includes the metal oxide 42 on the sidewalls 36. The metal oxide 42 may provide better adhesion with molding or underfill material relative to uncoated sidewalls.

Still referring to FIG. 3, in an embodiment the bottom width 38 of the metal bump 16, which is closest to the integrated circuit 26 (FIG. 1), is larger than the top width 40 of the metal bump 16, which is furthest from the integrated circuit 26. In an embodiment, the top width 40 is between about 10 µm to about 80 µm. In an embodiment, the bottom width 38 is between about 20 µm to about 90 µm. In an embodiment, the ratio of the top width 40 to the bottom width 38 of the metal bump 16 in FIG. 3 is between about 0.5 and about 0.89.

One skilled in the art will recognize that the specific dimensions for the various widths and spacing discussed herein are matters of design choice and are dependent upon the particular technology node, and application employed.

In an embodiment, a photolithography process is used to shape the metal bump 16 as shown in FIG. 3. Indeed, in the photolithography process a photoresist may be shaped appropriately in order to produce the metal bump 16 in the form illustrated in FIG. 3. In an embodiment, the metal bump 16 may be formed using an electrolytic plating process.

Figure 4:
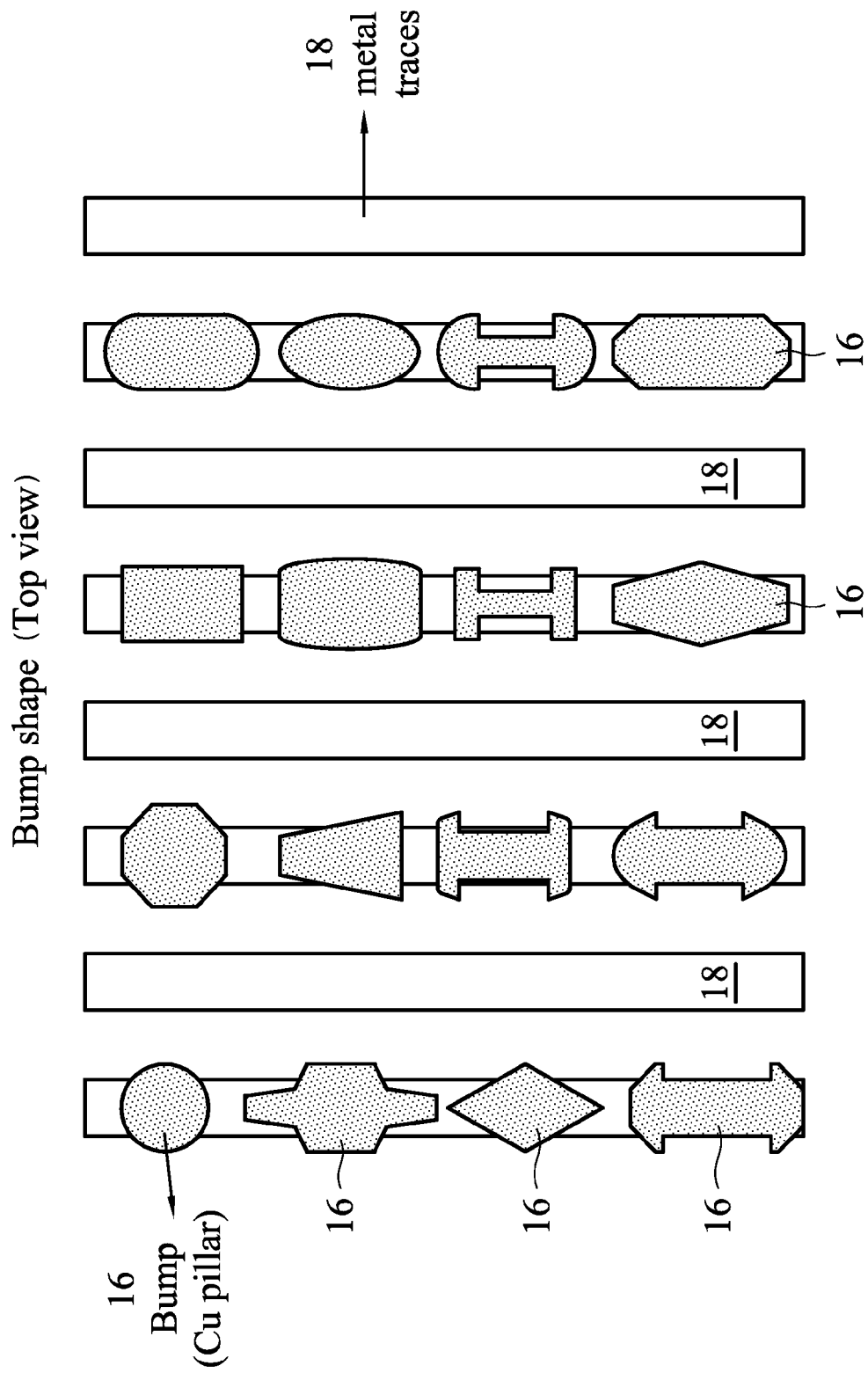
FIG. 4 is a plan view of the metal bump from the BOT structure of FIG. 1 illustrating various periphery shapes.

Referring now to FIG. 4, a periphery of the metal bump 16 may take or resemble a variety of different shapes when viewed from above. In an embodiment, the metal bump 16 is in the form of a circle, a rectangle, an ellipse, an obround, a hexagon, an octagon, a trapezoid, a diamond, a capsule, and combinations thereof when viewed from the end mounted to the integrated circuit 26 in FIG. 1. In FIG. 4, the periphery of the metal bump 16 is shown relative to the underlying metal substrate trace 18 of FIG. 1.

Figure 5:
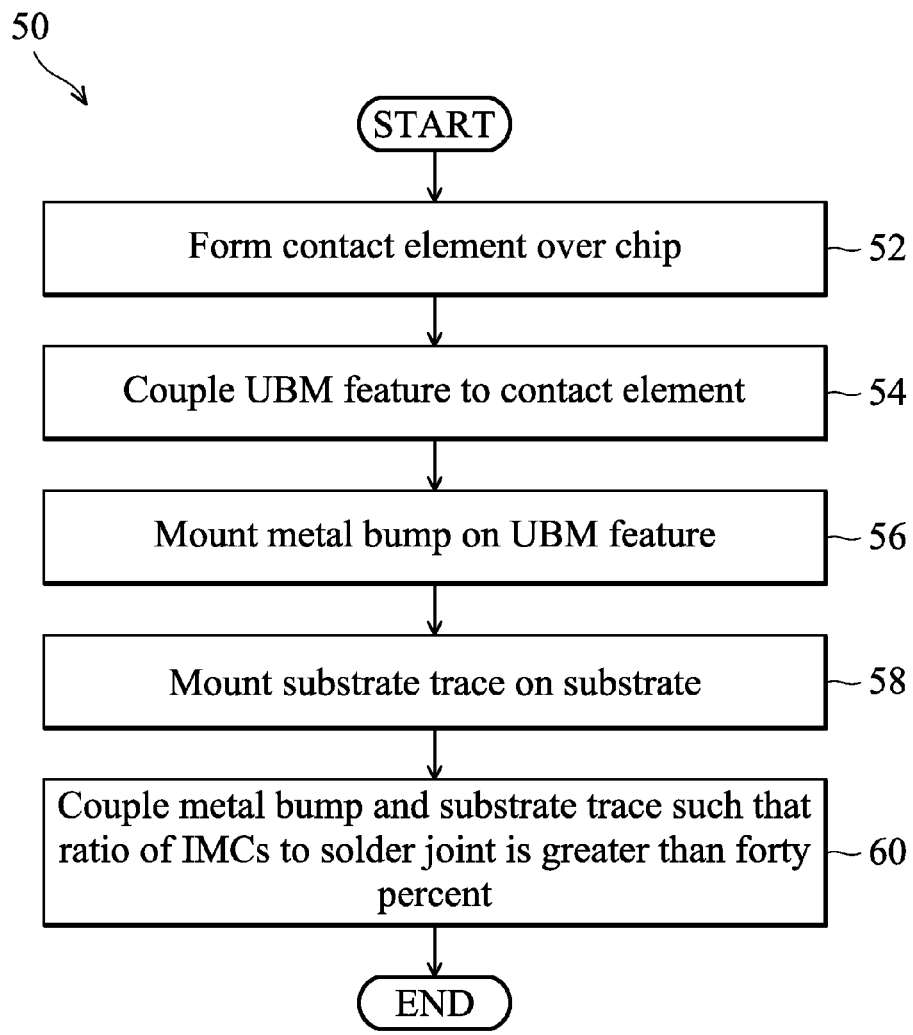
FIG. 5 is a method of forming the BOT structure of FIG. 1.

Referring now to FIG. 5, an embodiment method 50 of forming the BOT structure 10 of FIG. 1 is provided. In block 52, the contact element 12 is formed over the integrated circuit 26. In block 54, the UBM feature 14 is electrically coupled to the contact element 12. In block 56, the metal bump 16 is mounted on the UBM feature 14. In block 58, the substrate trace 18 is mounted on the substrate 20. In block 60, the substrate trace 18 is mounted to the metal bump 16 using the solder joint 22 and the intermetallic compounds 24 such that the ratio of a cross sectional area of the intermetallic compounds 24 to a cross sectional area of the solder joint 22 is greater than forty percent.

From the foregoing it should be recognized that embodiment BOT structure 10 provides advantageous features. For example, the BOT assembly 10 permits fine pitch configurations while still providing an increased electromigration resistance due to the conglomeration 34 of the solder joint 22 and the IMCs 24, which has lower diffusivity compared to only solder. Therefore, the time to electromigration failure is slower.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment bump on trace (BOT) structure includes a contact element supported by an integrated circuit, an under bump metallurgy (UBM) feature electrically coupled to the contact element, a metal bump on the under bump metallurgy feature, and a substrate trace on a substrate, the substrate trace coupled to the metal bump through a solder joint and intermetallic compounds, a ratio of a first cross sectional area of the intermetallic compounds to a second cross sectional area of the solder joint greater than forty percent.

An embodiment bump on trace (BOT) structure including a contact element supported by an integrated circuit, an under bump metallurgy (UBM) feature electrically coupled to the contact element, a metal bump on the under bump metallurgy feature, a substrate trace on a substrate, intermetallic compounds on the metal bump and on the substrate trace, and a solder joint formed between the intermetallic compounds disposed on the metal bump and on the substrate trace, a ratio of a first cross sectional area of the intermetallic compounds to a second cross sectional area of the solder joint greater than forty percent.

An embodiment method of forming a bump on trace (BOT) structure includes forming a contact element over an integrated circuit, electrically coupling an under bump metallurgy (UBM) feature to the contact element, forming a metal bump on the under bump metallurgy feature, forming a substrate trace on a substrate, and coupling the substrate trace to the metal bump using a solder joint, wherein intermetallic compounds are formed between the substrate trace and the metal bump, a ratio of a first cross sectional area of the intermetallic compounds to a second cross sectional area of the solder joint greater than forty percent.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bump on trace (BOT) structure, comprising:
a contact element supported by an integrated circuit;
an under bump metallurgy (UBM) feature electrically coupled to the contact element;
a metal bump on the under bump metallurgy feature; and
a substrate trace on a substrate, the substrate trace coupled to the metal bump through a solder joint, an additional metal, and intermetallic compounds, a ratio of a first cross sectional area of the intermetallic compounds to a second cross sectional area of the solder joint greater than forty percent;
wherein the additional metal is interposed between the metal bump and the solder joint, wherein the additional metal comprises nickel, and wherein the solder joint completely separates intermetallic compounds adjacent the metal bump and intermetallic compounds adjacent the substrate trace.

2. The structure of claim 1, wherein the metal bump has a non-tapering profile.

3. The structure of claim 1, wherein a bottom width of the metal bump is equal to a top width of the metal bump.

4. The structure of claim 1, wherein the metal bump has a tapering profile.

5. The structure of claim 1, wherein a bottom width of the metal bump is greater than a top width of the metal bump.

6. The structure of claim 1, wherein a ratio of a top width of the metal bump to a bottom width of the metal bump is between about 0.5 to about 0.89.

7. The structure of claim 1, wherein the first tapering profile of the metal bump is linear.

8. The structure of claim 1, wherein sidewalls of the metal bump are coated with a metal oxide.

9. The structure of claim 1, wherein a periphery of the metal bump resembles one of a circle, a rectangle, an ellipse, an obround, a hexagon, an octagon, a trapezoid, a diamond, a capsule, and combinations thereof when viewed from a mounted end.

10. The structure of claim 1, wherein the substrate trace is provided with a surface treatment.

11. A bump on trace (BOT) structure, comprising:
a contact element supported by an integrated circuit;
an under bump metallurgy (UBM) feature electrically coupled to the contact element;
a metal bump on the under bump metallurgy feature;
a substrate trace on a substrate;
intermetallic compounds disposed on the metal bump and on the substrate trace; and
a solder joint formed between the intermetallic compounds on the metal bump and on the substrate trace, a ratio of a first cross sectional area of the intermetallic compounds to a second cross sectional area of the solder joint greater than forty percent, wherein the solder joint completely separates the intermetallic compounds adjacent the metal bump and the intermetallic compounds adjacent the substrate trace.

12. The structure of claim 11, wherein the metal bump has a tapering profile.

13. The structure of claim 11, wherein a ratio of a top width of the metal bump to a bottom width of the metal bump is between about 0.5 to about 0.89.

14. The structure of claim 11, wherein sidewalls of the metal bump are coated with a metal oxide.

15. The structure of claim 11, wherein the substrate trace is provided with a surface treatment, the surface treatment one of an organic solderability preservative (OSP) and an immersion tin (IT).

16. A method of forming a bump on trace (BOT) structure, comprising:
forming a contact element over an integrated circuit;
electrically coupling an under bump metallurgy (UBM) feature to the contact element;
forming a metal bump on the under bump metallurgy feature;
forming a substrate trace on a substrate; and
coupling the substrate trace to the metal bump using a solder joint, wherein intermetallic compounds are formed between the substrate trace and the solder joint, and wherein intermetallic compounds are formed between the metal bump and the solder joint, a ratio of a first cross sectional area of the intermetallic compounds to a second cross sectional area of the solder joint greater than forty percent, wherein the solder joint completely separates the intermetallic compounds interposed between the substrate trace and the solder joint and the intermetallic compounds interposed between the metal bump and the solder joint.

17. The method of claim 16, further comprising inserting an additional metal between the metal bump and the solder joint.

18. The method of claim 17, wherein the additional metal is nickel.

19. The method of claim 16, wherein the metal bump has a tapering profile and metal oxide on sidewalls.

20. The method of claim 17, wherein the additional metal comprises nickel.

* * * * *